United States Patent
Segal et al.

(10) Patent No.: US 11,606,104 B1
(45) Date of Patent: Mar. 14, 2023

(54) DATA INTEGRITY PROTECTION

(71) Applicant: Amazon Technologies, Inc., Reno, NV (US)

(72) Inventors: Avigdor Segal, Netanya (IL); Leonid Baryudin, San Jose, CA (US); Erez Izenberg, Tel Aviv-Jaffa (IL); Erez Sabbag, Koranit (IL); Se Wang Oh, San Jose, CA (US); Noga Smith, Cupertino, CA (US)

(73) Assignee: Amazon Technologies, Inc., Reno, NV (US)

( * ) Notice: Subject to any disclaimer, the term of this patent is extended or adjusted under 35 U.S.C. 154(b) by 0 days.

(21) Appl. No.: 17/545,846

(22) Filed: Dec. 8, 2021

(51) Int. Cl.
*G06F 11/00* (2006.01)
*H03M 13/09* (2006.01)
*G06F 11/14* (2006.01)

(52) U.S. Cl.
CPC ....... *H03M 13/096* (2013.01); *G06F 11/1415* (2013.01); *G06F 2201/875* (2013.01)

(58) Field of Classification Search
CPC .. H03M 13/096; H03M 13/095; H03M 13/09; H03M 13/03; G06F 11/1415; G06F 11/14; G06F 11/1464; G06F 2201/875
See application file for complete search history.

(56) References Cited

U.S. PATENT DOCUMENTS

| | | | |
|---|---|---|---|
| 2016/0321133 A1* | 11/2016 | Oliver | H04L 63/064 |
| 2019/0050285 A1* | 2/2019 | Lin | G06F 11/1044 |
| 2020/0387424 A1* | 12/2020 | Lee | G06F 11/1068 |
| 2021/0255783 A1* | 8/2021 | Ou | G06F 3/064 |

* cited by examiner

*Primary Examiner* — Christine T. Tu
(74) *Attorney, Agent, or Firm* — Hogan Lovells US LLP

(57) ABSTRACT

The integrity of transmitted data can be protected by causing that data to be transmitted twice, and calculating protection information (PI) for the data from each transmission. The PI can include information such as a checksum or signature that should have the same value if the data from each transmission is the same. If the PI values are not the same, an error handling procedure can be activated, such as may retry the transmission. For write operations, the data can be transmitted twice from a source to a storage destination, while for read operations, the data can be transmitted to a recipient then sent back from the recipient to the storage device, with PI calculated for each transmission. A component such as a storage processor can perform at least this comparison step. Such approaches can also be used for network transmission or high performance computing.

20 Claims, 7 Drawing Sheets

DATA INTEGRITY PROTECTION

BACKGROUND

Data integrity is important in a number of different situations, as may relate to data storage, networking, and high performance computing (HPC). Various protocols exist that enable a user to protect the integrity of data by utilizing additional metadata that can be used to identify issues such as data corruption or mismatch. In most cases this represents additional complexity and overhead on the user system, requiring special host drivers or allocations of additional memory and processing. Many users do not utilize these protection mechanisms simply because the host hardware and software (e.g., operating system) available to them does not provide this support.

BRIEF DESCRIPTION OF THE DRAWINGS

Various embodiments in accordance with the present disclosure will be described with reference to the drawings, in which.

DETAILED DESCRIPTION

Approaches described and suggested herein relate to protecting the integrity of data. Such approaches can enable end to end data integrity protection that will work with any or most host hardware or software, where complexity is shifted to an endpoint device and executed transparently to a user. Various approaches provide an ability to ensure integrity of data throughout a data storage system, including a "last inch" between a source, such as host memory, and an ultimate storage destination, such as physical storage. In at least one embodiment, data along such a path can be transmitted twice, and an instance of protection information (PI) calculated for the data from each transmission. The PI can include information such as a checksum or signature that should have the same value for each transmission if the data from each transmission is the same, and has not experienced an error such as a bit flip or value corruption. If the PI values are not the same, it can be determined that an error likely occurred during transmission, and an error handling procedure can be activated, such as more transmission retries, taking further remedial action if errors are detected repeatedly. For write operations, the data can be transmitted twice from a source to a storage destination, and PI calculated for each transmission. For read operations, the data can be transmitted to a recipient then pulled back from the recipient to the storage device, with PI calculated for each transmission. A component such as a storage processor can perform this comparison step. Such approaches can be used in other situations as well, such as for network transmission or high performance computing operations, or other situations where transmission of data occurs and data integrity is important.

Various other such functions can be used as well within the scope of the various embodiments as would be apparent to one of ordinary skill in the art in light of the teachings and suggestions contained herein.

In the following description, various embodiments will be described. For purposes of explanation, specific configurations and details are set forth in order to provide a thorough understanding of the embodiments. However, it will also be apparent to one skilled in the art that the embodiments may be practiced without the specific details. Furthermore, well-known features may be omitted or simplified in order not to obscure the embodiment being described.

Figure 1:
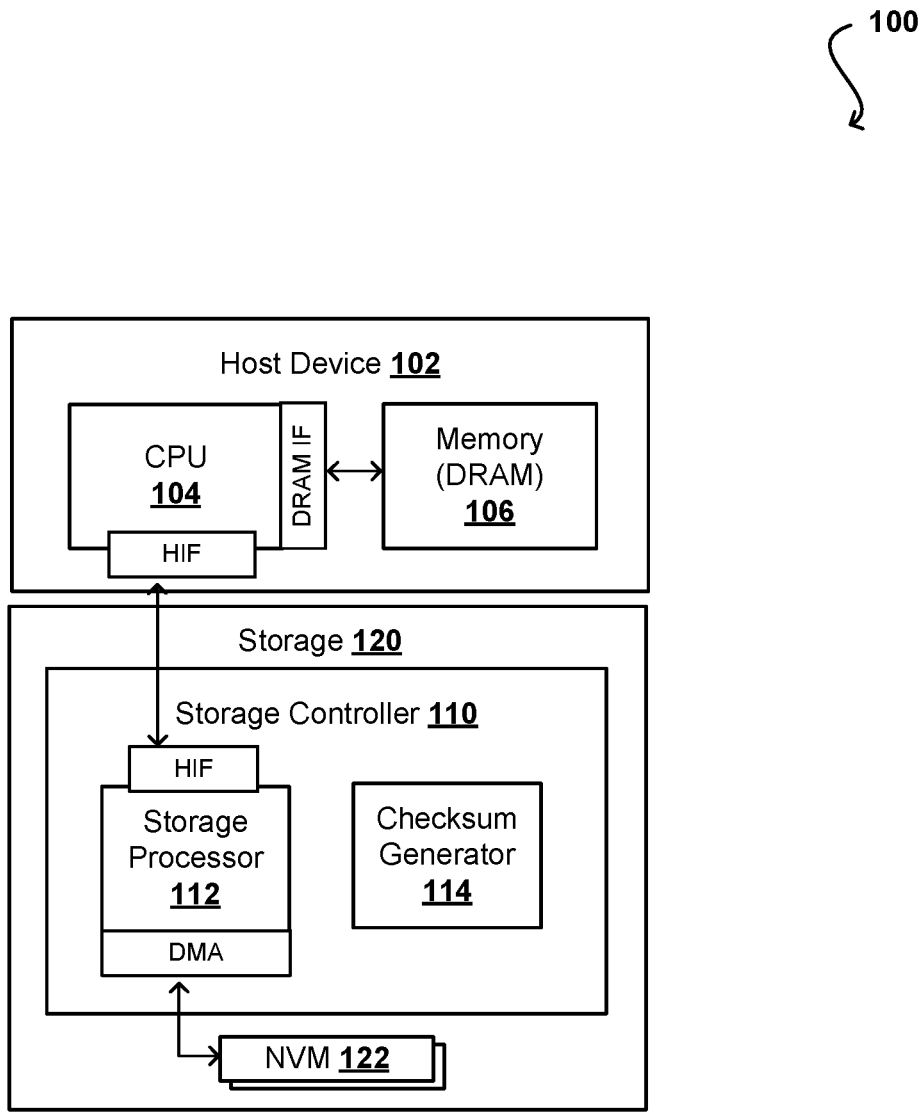
FIG. 1 illustrates an example system for storing and accessing data that can be utilized in accordance with various embodiments.

FIG. 1 illustrates an example system 100 that can be used to store and access data in accordance with various embodiments. In this example, a device such as a host device 102 can store data in a local memory 106, such as dynamic random-access memory (DRAM), that is to be processed using one or more processors, such as a central processing unit (CPU) 104 of the host device 102. The host device can be any appropriate device, such as a desktop computer, notebook computer, or server, among other such options. The host device 102 may attempt to cause at least some of this data to be written to a storage device 120, such as a solid state storage device or other device that includes physical or virtual storage, such as may be provided by at least one non-volatile memory (NVM) device 122. The host device 102 may also want to read data from this storage device 120 for processing by the CPU 104 or other such purposes. In some embodiments, the storage device may take the form of an input/output (I/O) device that includes storage and a storage processor, for example, such as a network interface card (NIC), controller card, system on chip (SoC) or ASIC.

In this example, the host CPU 104 can utilize a storage controller 110 to write data to, and read data from, this storage device 120. This storage controller may take any of a number of forms, such as a card or dongle plugged into the host device; a card, dongle, or component connected directly to the storage device; a component of a system on chip (SoC) implementation; or a standalone component in between the host device 102 and storage device 120, among other such options. In many embodiments storage controller 110 and storage 120 are integral parts of a so-called solid state drive (SSD). In at least one embodiment, this storage controller can utilize a hardware interface (HIF), such as a PCI Express (PCI) interface, to communicate with the host CPU 104, and can utilize an interface such as a direct memory access (DMA) interface that can transfer data utilizing a protocol such as, for example, non-volatile memory (NVEM) express (NVMe). Other data transfer protocols can be utilized as well, such as a serial advanced technology attachment (SATA) protocol.

For various applications, high reliability or integrity can be required for data stored to such a storage system 120. In many situations, there are mechanisms for ensuring the integrity of data in a host device 102, as well as mechanisms for ensuring the integrity of data in the storage device 120, but there may not be an appropriate mechanism in place for protecting the integrity of data transmitted between the host device 102 and the storage device 120, or between two other such data storage or processing devices, components, processes, applications, or systems. For example, there may be random errors experienced in the hardware due to, for example, cosmic radiation or solar flares. There may also be random errors resulting from bugs in the software used to read, write, process, or transmit the data. In many cases these data errors will be rare, and thus can be difficult to detect. Because these errors are random, however, performing a similar operation at least two times can enable such errors to be detected, as the error will occur in at most one of the performances, or if an error occurs in two performances the error will most likely be different. In any case, an error in the data can be detected based at least in part upon these differences.

Accordingly, approaches in accordance with various embodiments can attempt to protect the integrity of data, at least in part, by performing additional operations with respect to data to be written to, or read from, a storage device. Information, such as protection information (PI), can be compared between these operations, and any differences used to identify a presence of one or more errors in these data operations, which can be used to trigger one or more error-handling procedures. Protection information as used herein is not be limited to an NVMe-specific context, and should be interpreted to include any data, or metadata, that can be used to verify accuracy of data or content regardless of format or transmission protocol. Protection information may include values such as digital signatures, checksums, cyclic redundancy check (CRC such as CRC-16 or CRC-32) values, digital fingerprints, or hash values (e.g., MD5, SHA-1, SHA-256, SHA-512) that are within the capability of the relevant systems or drivers, among other such options. Protection information can be generated based on the data itself, and can be stored, added to, embedded, or associated with the data. This additional data does not need to be provided to, or received from, a user or customer associated with the data, however, and may be used to verify integrity of any data transmission between a source and a recipient system, device, component, module, or process.

Figure 2A:
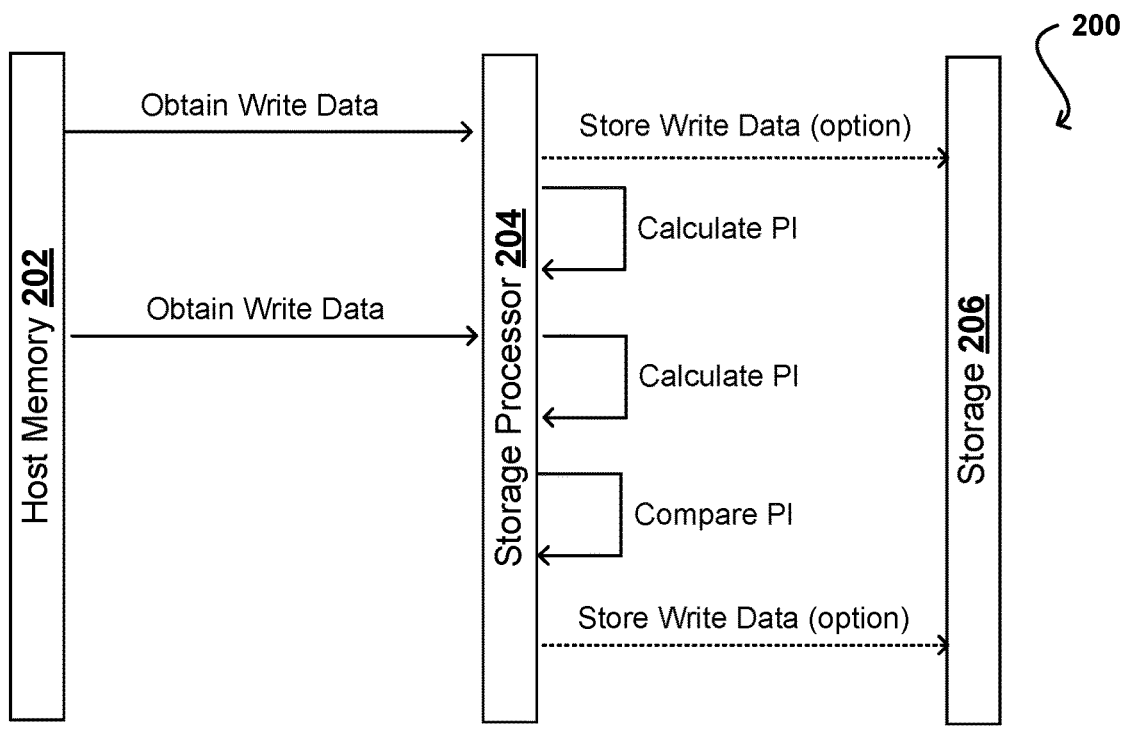
FIGS. 2A and 2B illustrate example flows for determining an integrity of data during write and read procedures, in accordance with various embodiments.
Figure 2B:
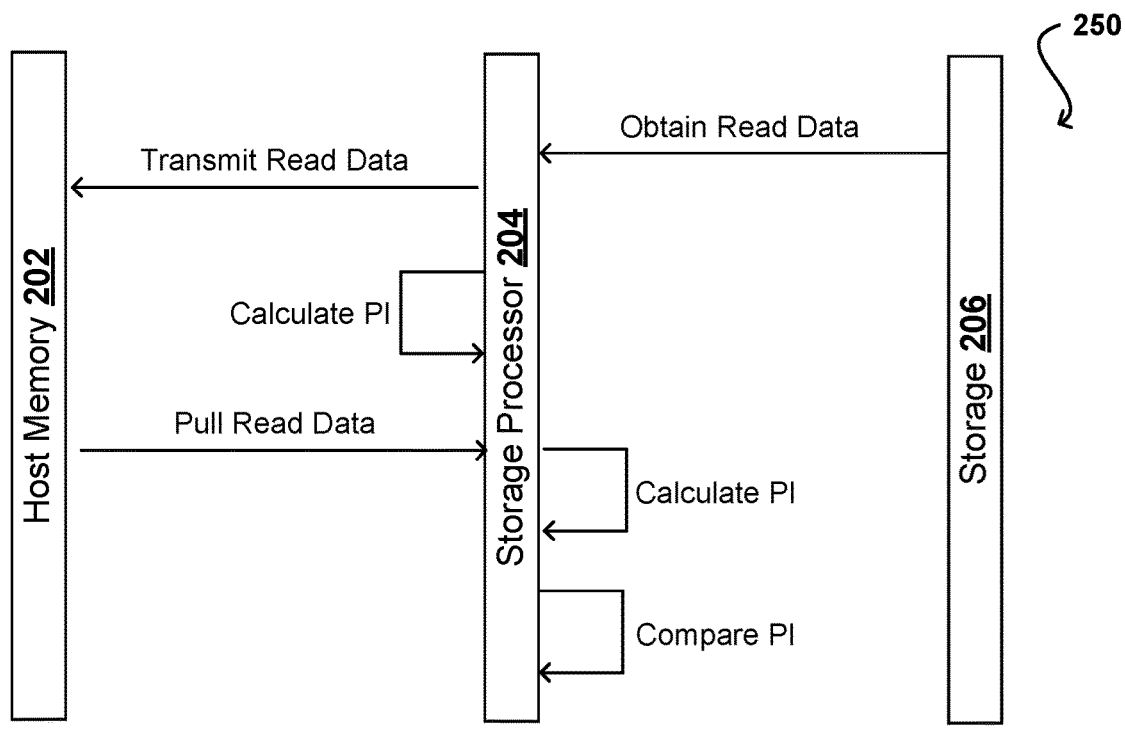

FIGS. 2A and 2B illustrate example process flows that demonstrate how such protection information can be used to verify the integrity of data in various situations. The process flow 200 of FIG. 2A is for a write operation to be performed, on behalf of a host, by a storage device under direction of a storage processor or other integrated circuit configured to handle storage-related operations. It should be understood, however, that such a process can be utilized advantageously for any digital data transmission from a host to a recipient of various types, configurations, and capabilities. In this example, data to be written to a storage device 206 is obtained from host memory 202 and received to a storage processor 204 before being written to the storage device 206. As mentioned, in some embodiments the storage processor may be part of the storage device (or host device), and writing data to the storage device may refer to writing the data to physical memory, such as SSD. In this example, the data can be analyzed to calculate protection information for this first transmission of data. As mentioned, this may include calculating a signature or checksum for the data, among other such options. Instead of writing this data to the storage device, however, this data can be discarded (or otherwise cached or handled) and a second transmission of this data can be performed to obtain a second copy of this data. In various embodiments, this second transmission can be initiated in response to a request from the storage processor 204, can be sent automatically in a subsequent transmission initiated by the host memory 202, or may be sent concurrently or in parallel with the first transmission, among other such options. Data of interest from this second transmission, which should include a payload or set of data that is identical to data from the first transmission (apart from any transmission-specific metadata that may be transmission dependent, etc.), can also have protection information calculated. Because the underlying data used to generate the protection information for both transmissions should be identical, the instances of protection information (e.g., signatures or checksums) should also be identical. These instances of protection information can then be compared, and if the values are the same then it can be determined that the data was transmitted without error (e.g., corruption or data loss), and the data can be stored or written to the storage device 206. In other embodiments, the data from the first transmission can be written to the storage device 206 before verification of the protection information, as speculative writing can reduce latency for data that will be written correctly more often than not. If the protection information for the first and second transmissions are not the same, then an error handling procedure can be engaged, such as where this data can be deleted or invalidated in the storage device 206 and the write can be attempted again. In at least some embodiments, there can be other mechanisms in place to ensure that data written to the storage device by the storage processor will not experience such issues. Since only one copy of the data need be written to the storage device, data from this second transmission can be written since the first copy was deleted due to there being no need to keep two copies of the actual data in addition to the protection information for comparison. It should be understood, however, that the first copy of the data could be stored and written to the storage device, and that the first copy could be at least partially written to the storage device before the protection information is successfully compared in some embodiments, particularly where performance or latency may be critical, among other such approaches. If the instances of protection information differ in any way, or at least any unacceptable way, then an error handling procedure can be initiated, or other remedial action taken. This may include, for example, making another attempt to successfully write the data. Multiple issues with the transmission may indicate a different problem to be addressed.

In many embodiments thus calculated PI, or any of its derivatives, could be stored on storage 206 together with the write data itself. Then, this PI can be verified upon a data read operation (see below) even prior to transmitting to the host to ensure that data was not corrupted during its transmission to/from the storage device, or while being resident on that device. Such PI reuse for storage device internal data integrity protection is a very practical approach, and the one likely to be used in multiple embodiments. However, embodiments presented herein do not depend on PI being stored with the data or mandate such storing, being concerned instead with data integrity protection between components such as a host and a storage processor.

FIG. 2B illustrates another example process flow 250, but for a read operation to be performed. In this example, data to be read is obtained from a storage device 206 and analyzed by a storage processor 204 to calculate, or otherwise generate, protection information for the data. In this example, the data can be transmitted to the recipient, here a host or host memory 202, in response to a read request (or other read or push instruction). The protection information can be stored by the storage processor, and need not be transmitted to the host. A copy of that data can then be pulled or retransmitted back to the storage processor 204 from host memory 202. This can be in response to a request from the storage processor 204 or in response to instructions executed on the host, among other such options. Once this second copy of the data received by the storage processor 204, the storage processor can calculate a second instance of protection information. The storage processor can then compare this second instance of protection information against the first instance, to determine whether these instances match, or include the same value or information. Many embodiments require successful read completion message being sent by Storage Processor 204 to the Host allowing Host to use Read Data, already in its DRAM. This message will be sent if and only if PI instances match. In the case of any differences between the instances (which can be indicative of a transmission error) an error handling procedure can be initiated and if data has been corrected, successful read completion message may still be sent if required by embodiment. While it is possible that the first transmission completed successfully, errors should occur infrequently enough that handling an error resulting from the second transmission should not introduce an unacceptable risk or burden. If the instances of protection information match, then it can be determined that the write operation completed successfully, and the protection information can be discarded.

Such an ability to verify data integrity can be important for many different situations or applications, such as storage systems, networking, or high performance computing tasks that require high reliability. Achieving such integrity can otherwise be challenging, particularly in light of the growing size and complexity these systems. In the case of distributed, virtualized systems, this can prove even more challenging when taking into account additional security considerations. In many instances, non-volatile memory systems maintain error correction codes (ECC) to handle errors that occur within memory. This protects against most common errors, but does not protect an entire system. As mentioned, additional errors may be introduced by sources such as rare random bit flips (usually due to "cosmic" radiation or SERR), or due to software bugs that may cause, for example, sector mismatch.

While NVMe is used as a primary example herein, advantages of various embodiments can be utilized with various other host interface protocols as well. The NVMe protocol is compatible with SCSI Protection Information (PI), commonly known as T10 DIF, and SNIA DIX standards. This protection information can be used to significantly increase error detection capability and improve data integrity. In some embodiments, protection information can include a guard tag such as a CRC, a reference tab which may be part of a logical address of a sector, and an application tag which may be user-defined. Inclusion of information such as CRC data can enable identifying issues such as bit flips during transmission. A reference tag can help to identify a sector mismatch in the case of the wrong data being transmitted the second time (DRAM address mix up, for example). An application tag may be used for address extension or security reasons, such as for protection between applications and threads.

Using standard PI is usually a practical thing in many embodiments since existing storage processors likely feature hardware accelerations for such PI calculations. However, since PI is both calculated and verified by a storage processor, its format is not limited to any standard one, so an embodiment can provide stronger data integrity protection than any underlying host interface protocols being used.

As mentioned, such a solution can be based at least in part upon an assumption that errors introduced along a transmission path, such as a path between host memory and a storage device, are sporadic and do not repeat, or at least the probability of repetition is low enough to be ignored, if the same operation is performed more than once. This assumption can be based upon commonly experienced errors, such as Soft Errors (SERR) that may be caused by radiation and sometimes marginal hardware that was not detected by pre-production screening processes. As discussed previously, for a write operation a storage device can read data from the host twice, and generate PI for both reads. The generated PIs can be compared and if those are identical, the write operation may proceed. Otherwise, it can be assumed that at least one error was introduced and thus an error handling procedure can be activated. In order to reduce the load on internal engines of the storage system, one of these data passes may be only for PI generation, which can avoid writing the data to storage system memory. In at least one embodiment, a first pass would be for PI generation only, while a second pass can be used for PI validation and write operations on success. For read operations, a storage device can first write data to host memory, and can then read that data back. PI validation can occur on the read pass with respect to the PI calculated on the first transaction (additional optional comparison with PI, retrieved from the storage device will allow verify internal data integrity at the same instance). If validation is successful and those instances of PI are identical, it can be determined that the read operation completed successfully. Otherwise, it can be assumed that an error was introduced, and an error handling procedure can be activated. In order to reduce the load on internal engines of the storage system, the read back of the data may only be used to validate PI, with no need to also write the read data.

There may be various aspects to consider for such operations. For example, with respect to performance (e.g., throughput and latency), proposed write and read flow such as those in FIGS. 2A and 2B may both double the load on the host interface, including host DRAM and a PCIe bus, and may impact latency. In such situations only half of a total PCIe theoretical throughput could be used with higher power consumption. This double load may not be problematic in many situations, however, as in many cases, particularly with respect to newer host interfaces (e.g. gen5 PCIe links), the flash subsystem is the performance bottleneck and not the host interface. This may be especially true for write operations where the approach requires doubling of the PCIe load in the same direction, which may have a largest negative impact on the throughput. Storage devices may utilize non-volatile memory, such as NAND Flash, which can either read or write at any time, with read bandwidth generally being higher than write bandwidth. That being said, writes to non-volatile memory may be much higher than reads, but even twice the load on PCIe during writes will usually have low performance impact. Latency of a write operation can also be mitigated to almost negligible by issuing validation operations in parallel to other write operations. For read operations, a verification read from the host can happen in the opposite direction to main data transfer, and as such will not affect read throughput. Still, latency may increase due to additional validation operations being performed inline, such that it may be desirable in at least some embodiments to perform such operations after a main data transfer to the host has completed but prior to sending completion information to the host.

As an example, a system without integrity protection as presented herein may be capable of processing 100 Gbps read or 50 Gbps write over 128 Gbps capable PCIe. If utilizing integrity protection as presented herein, which system will still be capable of similar performance, at least with the PCIe not limiting this performance. Write can consume 100 Gbps out of PCIe on the path from the host to the device, which read can consume 200 Gbps out of PCIe, with 100 Gbps in each direction. Mixed traffic scenarios can present an additional level of complexity that may depend highly on the implementation.

With respect to memory protection, a host may in some cases introduce buffers with "single direction" capability according to an expected operation. For write operations the buffers may be read only from PCI Storage Device, for example, while for read operations the buffers may be write only. Such an approach can the storage system form implementing certain read flows in certain situations. In such an instance, an approach can consider that in virtualized systems or environments such as may be present in data centers, a storage device may have more freedom to access virtualized machines memory. Approaches as presented herein can enable a storage system to increase a level of data integrity available to a user (e.g., a customer of a data center), without the need to make any changes to the user's software and with a reasonable tradeoff on both performance and power. In at least some embodiments, this additional protection can be provided entirely by a provider of the storage system or service. Such additional protection in many instances can be implemented without any change to hardware, instead implemented through software run on the storage device or storage manager of the provider environment, with no change needed to a host system or user application.

In some embodiments, a user may be able to select whether or not to utilize this additional data integrity protection. For example, for data that may not be particularly error sensitive a user may select a performance option that does not utilize this additional protection, in order to conserve bandwidth and avoid any additional latency. The user may also be able to select to utilize this additional protection for any appropriate grouping or selection of data, at any appropriate granularity, from an entire dataset to an individual partition or transmission of data so additional data transactions will happen only for operations on that partition, thus conserving bandwidth and reducing latency. Such an approach can also be used with any appropriate local or distributed storage system, as may include NVMe over a network fabric, a local NVMe SSD, a scalable reliable datagram (SRD) or remote direct memory access (RDMA)-based system, or a virtualized storage system. Such an approach can be used to provide a symmetrical data integrity system as presented herein.

A storage processor can include at least one processing component, similar to a CPU or processor cord, with hardware acceleration, as may be part of a system on chip (SoC) implementation. Hardware acceleration can be used when, for example, calculating a checksum or comparing checksums. Software can be used to program at least a portion of the functionality of such a storage processor. The storage processor may utilize a DMA component to push or pull the data, and can be programmed to calculate checksums or other PI values for at least a portion of these data transmissions, which can be sent as metadata with the data or stored in local memory, among other such options.

Figure 3:
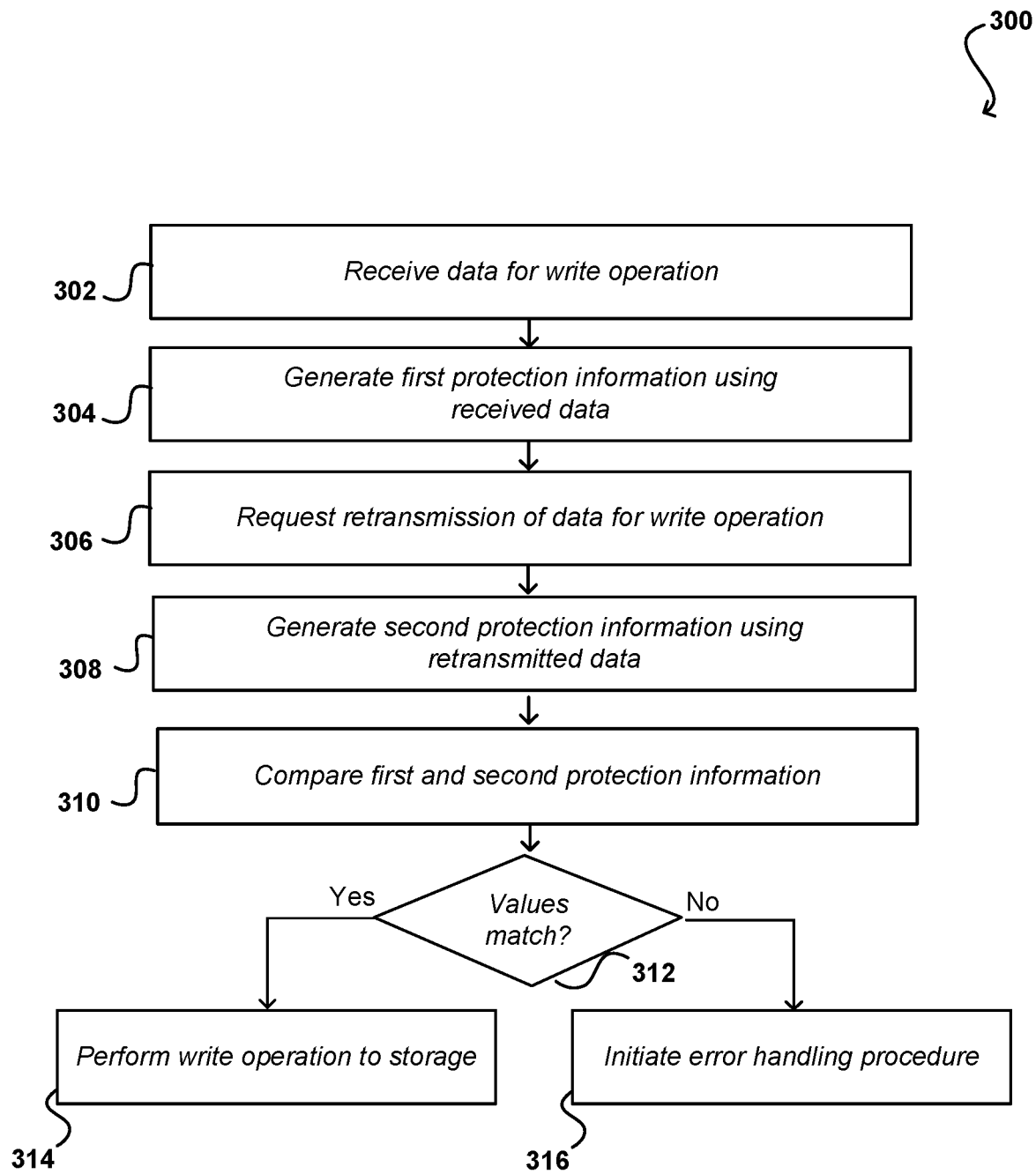
FIG. 3 illustrates an example process for ensuring an integrity of data for a write operation that can be utilized in accordance with various embodiments.

FIG. 3 illustrates an example process 300 for providing data integrity protection for write operations that can be utilized in accordance with various embodiments. It should be understood that for this and other processes presented herein that there can be additional, fewer, or alternative steps performed in similar or alternative orders, or at least partially in parallel, within the scope of the various embodiments unless otherwise specifically stated. In this example, data is received 302 for a write operation to be performed, where that data may have been transmitted over at least one interface from a source such as a host device. A storage processor can analyze this received data to generate 304 first protection information (PI), such as a signature or checksum generated based on that data. In this example the storage processor can request 306 a retransmission, or second transmission, of the data to be written to the storage system. The storage processor can then generate 308 a second instance of PI based on the data received in this second transmission. The storage processor can then compare 310 these first and second instances, which should have identical values if generated using data that has completely similar data values from both transmissions. If it is determined 312 that the first and second instances of protection information match, then the write operation can be performed 314 to cause the received data from one of the transmissions to be stored to an appropriate storage device, such as an SSD. If it is determined that the values do not match (e.g., the values are not the same), then it can be determined that there was likely an error during transmission and an error handling procedure can be initiated 316 to attempt to obtain a copy of the data to be written to the storage device that is free from such errors. In at least one embodiment, these errors may relate to bit flips or data corruption, or may refer to mixture of data that may cause the data to be written to the wrong location, among other such errors discussed herein and otherwise detectable or predictable within the scope of the various embodiments.

Figure 4:
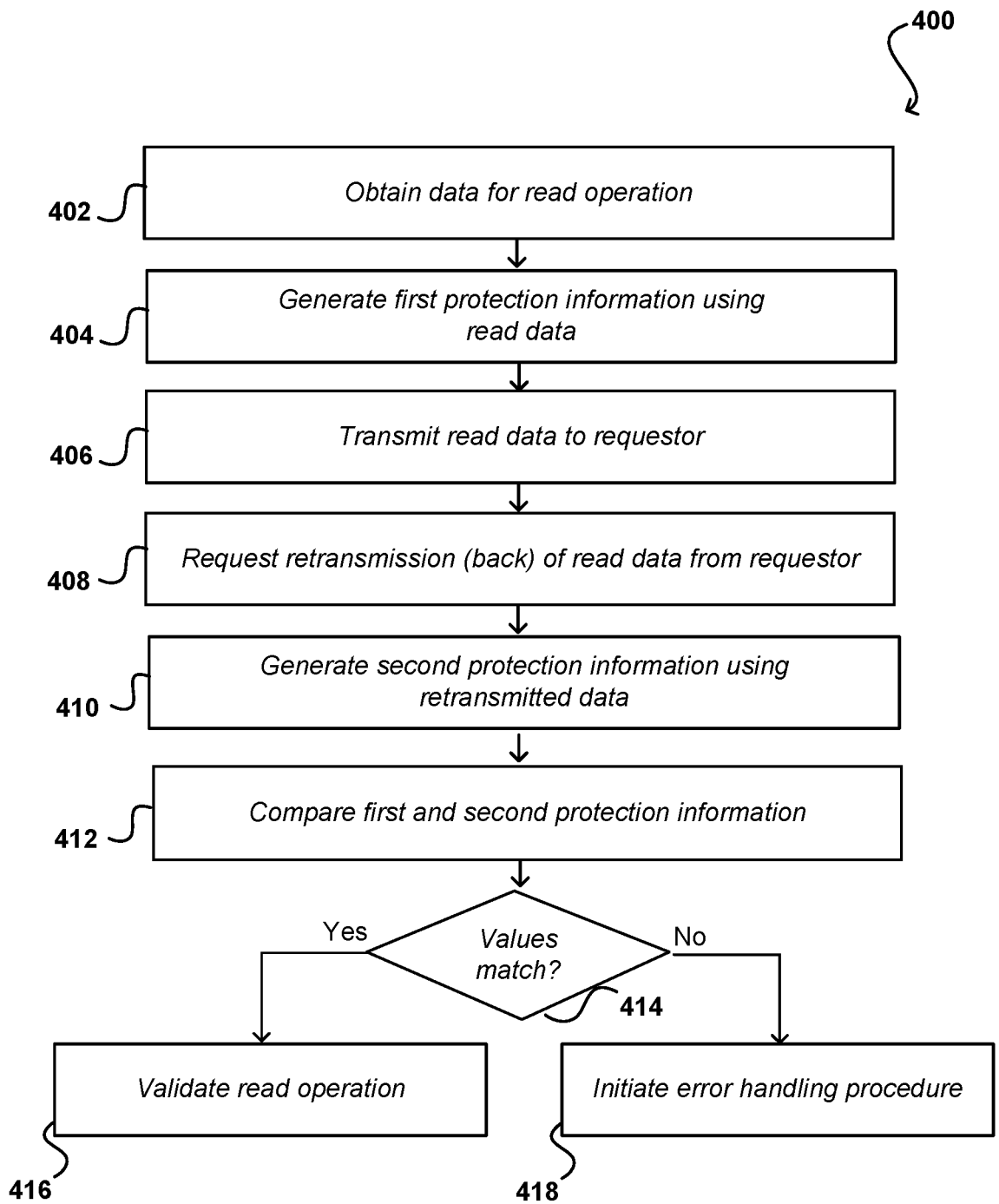
FIG. 4 illustrates an example process for ensuring an integrity of data for a read operation that can be utilized in accordance with various embodiments.

FIG. 4 illustrates an example process 400 for providing data integrity protection for read operations that can be utilized in accordance with various embodiments. In this example, data for a read operation is obtained 402, such as being retrieved from a storage device in response to a read request from a host device or other such source. A storage processor can analyze this data before it is transmitted in order to generate 404 first protection information, such as a signature or checksum, based on the data. In some embodiments this first protection information can be calculated (generated) on the flight which data will be transmitted to the requestor on the next step. The read data can then be transmitted 406 to the requestor or other destination. In this example, the storage device can also request 408 a retransmission of the data back from the requestor. Such an approach can enable this functionality to be implemented without any, or at least any significant, modification of the host device or other requestor system. The storage processor can then generate 410 a second instance of protection information using the data that is transmitted back from the requestor system, such as the host device. The first and second instances of protection information can be compared 412 by the storage processor, or another such component. If it is determined 414 that the values match, or that the first and second PI values are the same, then the read operation can be validated 416. If the values are determined not to be the same, however, then an error handling procedure can be initiated 418, such as to attempt to successfully resend the data without error.

Figure 5:
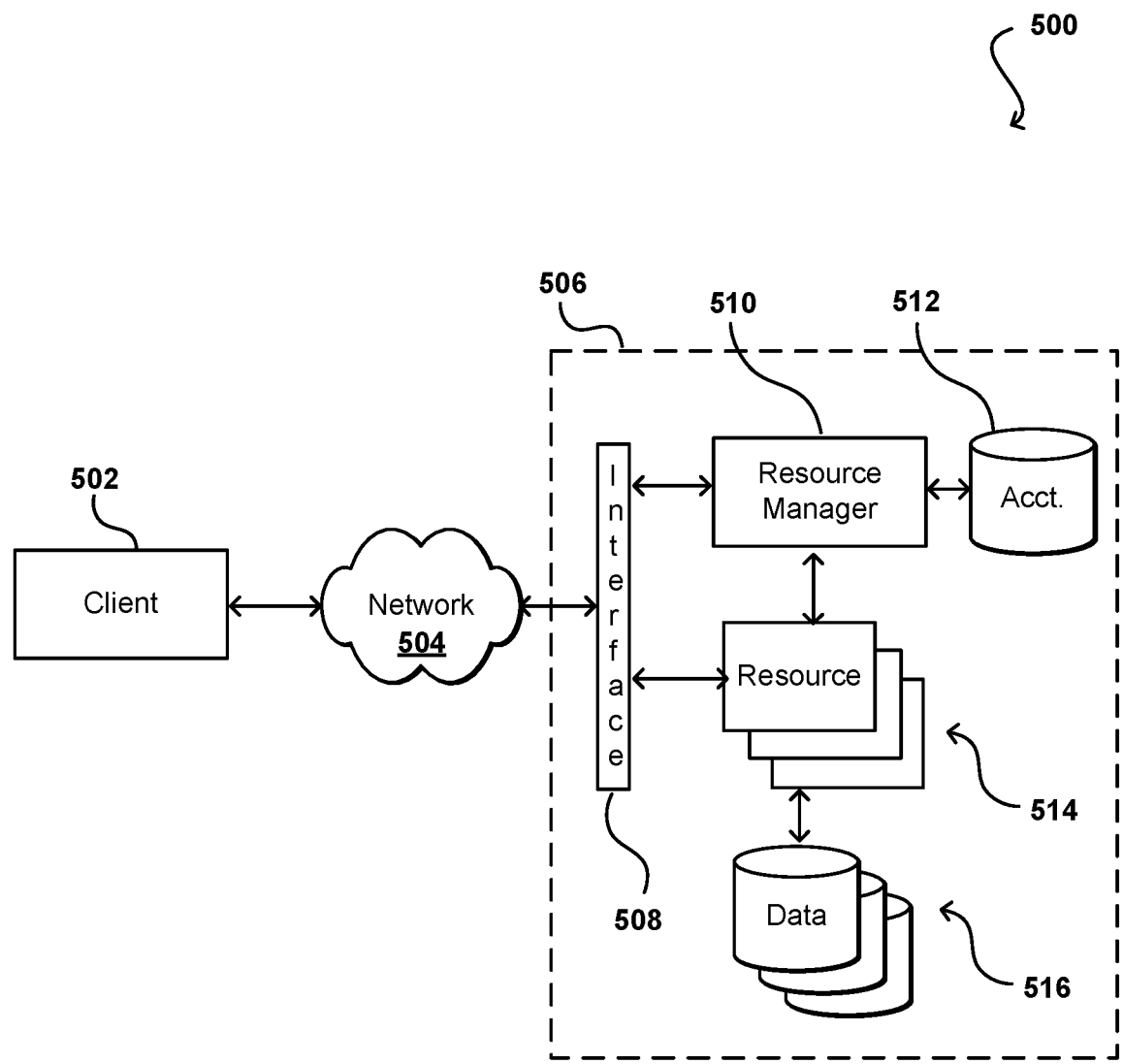
FIG. 5 illustrates components of an example resource environment in which aspects of various embodiments can be implemented.

FIG. 5 illustrates an example environment 500 in which aspect of various embodiments can be implemented. Such an environment can be used in some embodiments to provide resource capacity for one or more users, or customers of a resource provider, as part of a shared or multi-tenant resource environment. In this example a user is able to utilize a client device 502 to submit requests across at least one network 504 to a multi-tenant resource provider environment 506. The client device can include any appropriate electronic device operable to send and receive requests, messages, or other such information over an appropriate network and convey information back to a user of the device. Examples of such client devices include personal computers, tablet computers, smart phones, notebook computers, and the like. The at least one network 504 can include any appropriate network, including an intranet, the Internet, a cellular network, a local area network (LAN), or any other such network or combination, and communication over the network can be enabled via wired and/or wireless connections. The resource provider environment 506 can include any appropriate components for receiving requests and returning information or performing actions in response to those requests. As an example, the provider environment might include Web servers and/or application servers for receiving and processing requests, then returning data, Web pages, video, audio, or other such content or information in response to the request. The environment can be secured such that only authorized users have permission to access those resources.

In various embodiments, a provider environment 506 may include various types of resources that can be utilized by multiple users for a variety of different purposes. As used herein, computing and other electronic resources utilized in a network environment can be referred to as "network resources." These can include, for example, servers, databases, load balancers, routers, and the like, which can perform tasks such as to receive, transmit, and/or process data and/or executable instructions. In at least some embodiments, all or a portion of a given resource or set of resources might be allocated to a particular user or allocated for a particular task, for at least a determined period of time. The sharing of these multi-tenant resources from a provider environment is often referred to as resource sharing, Web services, or "cloud computing," among other such terms and depending upon the specific environment and/or implementation. In this example the provider environment includes a plurality of resources 514 of one or more types. These types can include, for example, application servers operable to process instructions provided by a user or database servers operable to process data stored in one or more data stores 516 in response to a user request. As known for such purposes, a user can also reserve at least a portion of the data storage in a given data store. Methods for enabling a user to reserve various resources and resource instances are well known in the art, such that detailed description of the entire process, and explanation of all possible components, will not be discussed in detail herein.

In at least some embodiments, a user wanting to utilize a portion of the resources 514 can submit a request that is received to an interface layer 508 of the provider environment 506. The interface layer can include application programming interfaces (APIs) or other exposed interfaces enabling a user to submit requests to the provider environment. The interface layer 508 in this example can also include other components as well, such as at least one Web server, routing components, load balancers, and the like. When a request to provision a resource is received to the interface layer 508, information for the request can be directed to a resource manager 510 or other such system, service, or component configured to manage user accounts and information, resource provisioning and usage, and other such aspects. A resource manager 510 receiving the request can perform tasks such as to authenticate an identity of the user submitting the request, as well as to determine whether that user has an existing account with the resource provider, where the account data may be stored in at least one data store 512 in the provider environment. A user can provide any of various types of credentials in order to authenticate an identity of the user to the provider. These credentials can include, for example, a username and password pair, biometric data, a digital signature, or other such information. The provider can validate this information against information stored for the user. If a user has an account with the appropriate permissions, status, etc., the resource manager can determine whether there are adequate resources available to suit the user's request, and if so can provision the resources or otherwise grant access to the corresponding portion of those resources for use by the user for an amount specified by the request. This amount can include, for example, capacity to process a single request or perform a single task, a specified period of time, or a recurring/renewable period, among other such values. If the user does not have a valid account with the provider, the user account does not enable access to the type of resources specified in the request, or another such reason is preventing the user from obtaining access to such resources, a communication can be sent to the user to enable the user to create or modify an account, or change the resources specified in the request, among other such options.

Once the user is authenticated, the account verified, and the resources allocated, the user can utilize the allocated resource(s) for the specified capacity, amount of data transfer, period of time, or other such value. In at least some embodiments, a user might provide a session token or other such credentials with subsequent requests in order to enable those requests to be processed on that user session. The user can receive a resource identifier, specific address, or other such information that can enable the client device 502 to communicate with an allocated resource without having to communicate with the resource manager 510, at least until such time as a relevant aspect of the user account changes, the user is no longer granted access to the resource, or another such aspect changes. In some embodiments, a user can run a host operating system on a physical resource, such as a server, which can provide that user with direct access to hardware and software on that server, providing near full access and control over that resource for at least a determined period of time. Access such as this is sometimes referred to as "bare metal" access as a user provisioned on that resource has access to the physical hardware.

A resource manager 510 (or another such system or service) in this example can also function as a virtual layer of hardware and software components that handles control functions in addition to management actions, as may include provisioning, scaling, replication, etc. The resource manager can utilize dedicated APIs in the interface layer 508, where each API can be provided to receive requests for at least one specific action to be performed with respect to the data environment, such as to provision, scale, clone, or hibernate an instance. Upon receiving a request to one of the APIs, a Web services portion of the interface layer can parse or otherwise analyze the request to determine the steps or actions needed to act on or process the call. For example, a Web service call might be received that includes a request to create a data repository.

An interface layer 508 in at least one embodiment includes a scalable set of user-facing servers that can provide the various APIs and return the appropriate responses based on the API specifications. The interface layer also can include at least one API service layer that in one embodiment consists of stateless, replicated servers which process the externally-facing user APIs. The interface layer can be responsible for Web service front end features such as authenticating users based on credentials, authorizing the user, throttling user requests to the API servers, validating user input, and marshalling or unmarshalling requests and responses. The API layer also can be responsible for reading and writing database configuration data to/from the administration data store, in response to the API calls. In many embodiments, the Web services layer and/or API service layer will be the only externally visible component, or the only component that is visible to, and accessible by, users of the control service. The servers of the Web services layer can be stateless and scaled horizontally as known in the art. API servers, as well as the persistent data store, can be spread across multiple data centers in a region, for example, such that the servers are resilient to single data center failures.

Figure 6:
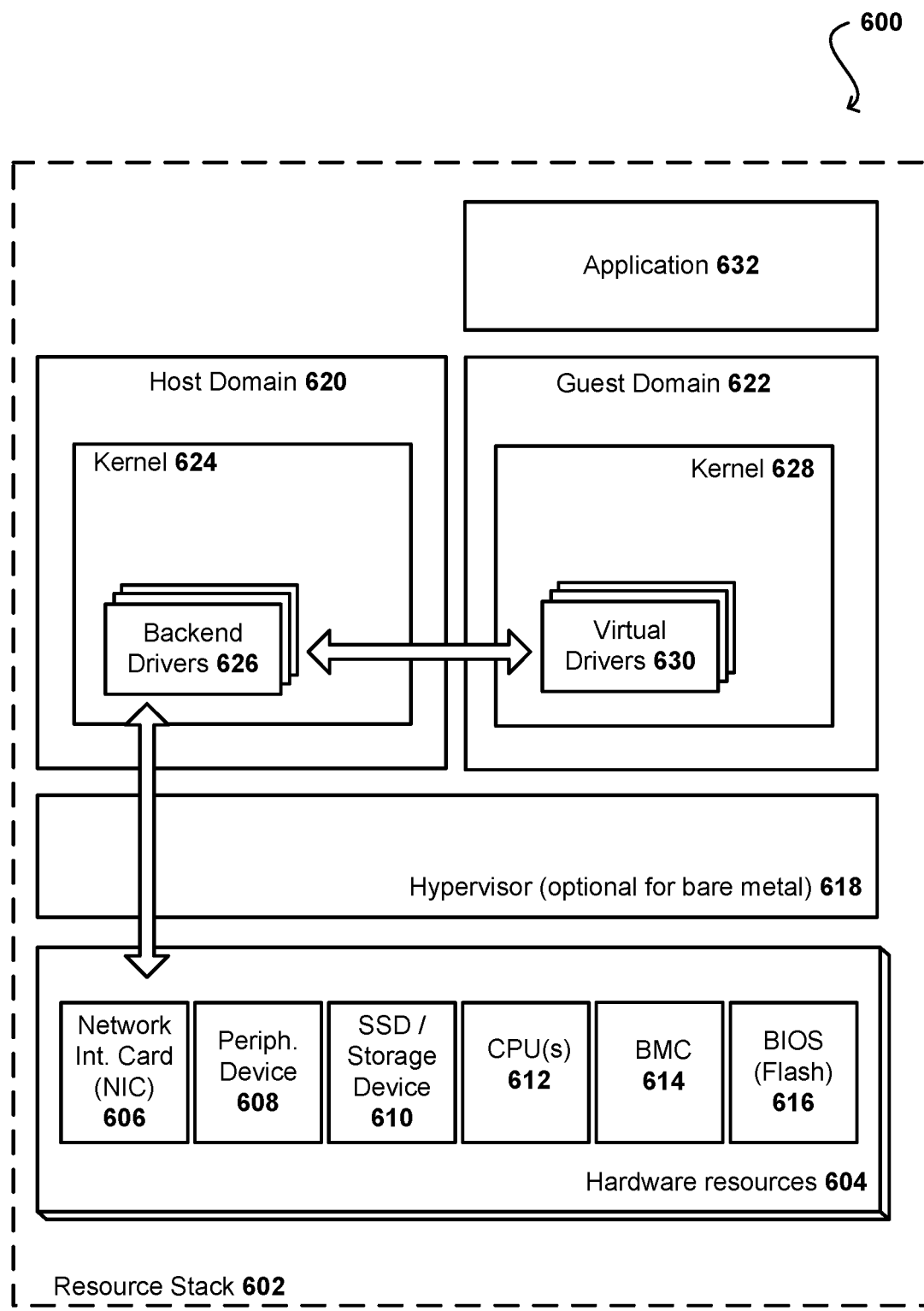
FIG. 6 illustrates components of an example virtualized environment that can be utilized in accordance with various embodiments.

FIG. 6 illustrates an example resource stack 602 of a physical resource 600 that can be utilized in accordance with various embodiments. Such a resource stack 602 can be used to provide an allocated environment for a user (or customer of a resource provider) having an operating system provisioned on the resource. In accordance with the illustrated embodiment, the resource stack 602 includes a number of hardware resources 604, such as one or more central processing units (CPUs) 612; solid state drives (SSDs) or other storage devices 610; a network interface card (NIC) 606, one or more peripheral devices (e.g., a graphics processing unit (GPU), etc.) 608, a BIOS implemented in flash memory 616, and a baseboard management controller (BMC) 614, and the like. In some embodiments, the hardware resources 604 reside on a single computing device (e.g. chassis). In other embodiments, the hardware resources can reside on multiple devices, racks, chassis, and the like. Running on top of the hardware resources 604, a virtual resource stack may include a virtualization layer such as a hypervisor 618 for a Xen-based implementation, a host domain 620, and potentially also one or more guest domains 622 capable of executing at least one application 632. The hypervisor 618, if utilized for a virtualized environment, can manage execution of the one or more guest operating systems and allow multiple instances of different operating systems to share the underlying hardware resources 604. Conventionally, hypervisors are installed on server hardware, with the function of running guest operating systems, where the guest operating systems themselves act as servers.

In accordance with an embodiment, a hypervisor 618 can host a number of domains (e.g., virtual machines), such as the host domain 620 and one or more guest domains 622. In one embodiment, the host domain 620 (e.g., the Dom-0) is the first domain created and helps virtualize hardware resources and manage all of the other domains running on the hypervisor 618. For example, the host domain 620 can manage the creating, destroying, migrating, saving, or restoring the one or more guest domains 622 (e.g., the Dom-U). In accordance with various embodiments, the hypervisor 618 can control access to the hardware resources such as the CPU, input/output (110) memory, and hypervisor memory.

A guest domain 622 can include one or more virtualized or para-virtualized drivers 630 and the host domain can include one or more backend device drivers 626. When the operating system (OS) kernel 628 in the guest domain 622 wants to invoke an I/O operation, the virtualized driver 630 may perform the operation by way of communicating with the backend device driver 626 in the host domain 620. When the guest driver 630 wants to initiate an I/O operation (e.g., to send out a network packet), a guest kernel component can identify which physical memory buffer contains the packet (or other data) and the guest driver 630 can either copy the memory buffer to a temporary storage location in the kernel for performing 110 or obtain a set of pointers to the memory pages that contain the packet(s). In at least one embodiment, these locations or pointers are provided to the backend driver 626 of the host kernel 624 which can obtain access to the data and communicate it directly to the hardware device, such as the NIC 606 for sending the packet over the network.

It should be noted that the resource stack 602 illustrated in FIG. 6 is only one possible example of a set of resources that is capable of providing a virtualized computing environment and that the various embodiments described herein are not necessarily limited to this particular resource stack. In some embodiments, the guest domain 622 may have substantially native or "bare metal" access to the NIC 606 hardware, for example as provided by device assignment technology based on an IO Memory Management Unit (IO-MMU) device mapping solution like Intel VT-D. In such an implementation, there may be no virtualization layer (e.g., Hypervisor) present. The host domain, or OS, may then be provided by the user, with no guest domains utilized. Other technologies, such Single Root IO Virtualization (SR-IOV), may provide similar "bare metal" functionality to guest domains for only certain functionality of the devices. In general, in various other embodiments, the resource stack may comprise different virtualization strategies, hardware devices, operating systems, kernels, domains, drivers, hypervisors and other resources.

In compute servers, a Board Management Controller (BMC) 614 can maintain a list of events that have occurred in the system, referred to herein as a system event log (SEL). In at least one embodiment, the BMC 614 can receive system event logs from the BIOS 616 on the host processor. The BIOS 616 can provide data for system events over an appropriate interface, such as an $I^2C$ interface, to the BMC using an appropriate protocol, such as an SMBus System Interface (SSIF) or KCS interface over LPC. As mentioned, an example of a system event log event from BIOS includes an uncorrectable memory error, indicating a bad RAM stick. In at least some embodiments, system event logs recorded by BMCs on various resources can be used for purposes such as to monitor server health, including triggering manual replacement of parts or instance degrade when SELs from the BIOS indicate failure.

As mentioned, in a virtualized environment the hypervisor 618 can prevent the guest operating system, or guest domain 622, from sending such system event log data to the BMC 614. In the case of bare metal access without such a hypervisor, however, user instances can have the ability to send data for system event that spoof events from the BIOS 616. Such activity could lead to compromised bare metal instances being prematurely degraded due to fake system event data produced by the user OS.

In at least one embodiment, however, there will be portions of the physical resource 600 that will be inaccessible to the user OS. This can include, for example, at least a portion of BIOS memory 616. BIOS memory 616 in at least one embodiment is volatile memory such that any data stored to that memory will be lost in the event of a reboot or power down event. The BIOS may keep at least a portion of host memory unmapped, such that it is not discoverable by a host OS. As mentioned, data such as a secret token can be stored to BIOS memory 616 at boot time, before a user OS is executing on the resource. Once the user OS is executing on the resource, that OS will be prevented from accessing that secret token in BIOS memory 616. In at least one embodiment, this secret token (or other stored secret) can be provided to the BMC 614 when adding system event log events, whereby the BMC 614 can confirm that the event is being sent by the BIOS 616 and not by the user OS.

Figure 7:
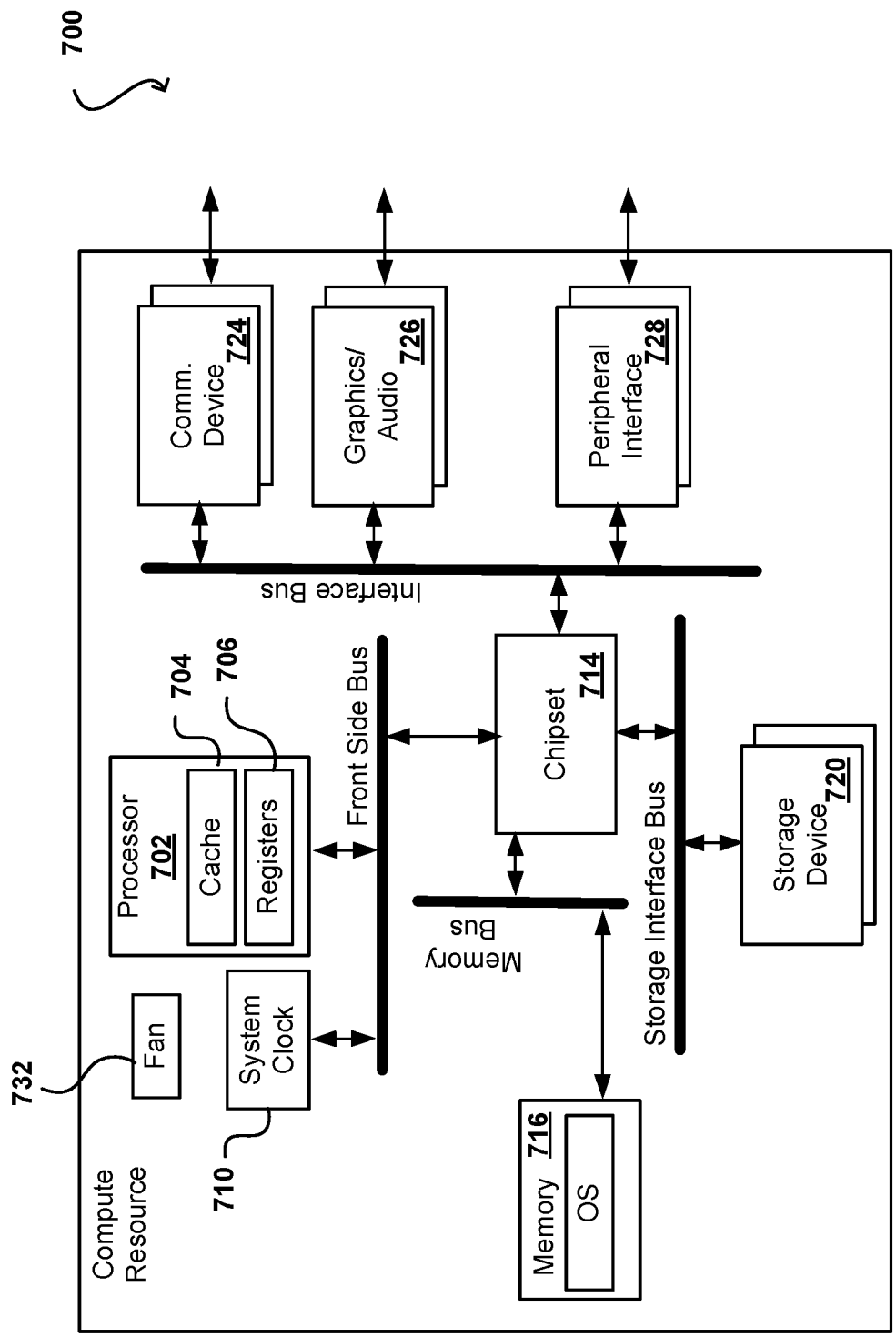
FIG. 7 illustrates example components of a computing device that can be used to implement aspects of various embodiments.

Computing resources, such as servers or personal computers, will generally include at least a set of standard components configured for general purpose operation, although various proprietary components and configurations can be used as well within the scope of the various embodiments. FIG. 7 illustrates components of an example computing resource 700 that can be utilized in accordance with various embodiments. It should be understood that there can be many such compute resources and many such components provided in various arrangements, such as in a local network or across the Internet or "cloud," to provide compute resource capacity as discussed elsewhere herein. The computing resource 700 (e.g., a desktop or network server) will have one or more processors 702, such as central processing units (CPUs), graphics processing units (GPUs), and the like, that are electronically and/or communicatively coupled with various components using various buses, traces, and other such mechanisms. A processor 702 can include memory registers 706 and cache memory 704 for holding instructions, data, and the like. In this example, a chipset 714, which can include a northbridge and southbridge in some embodiments, can work with the various system buses to connect the processor 702 to components such as system memory 716, in the form or physical RAM or ROM, which can include the code for the operating system as well as various other instructions and data utilized for operation of the computing device. The computing device can also contain, or communicate with, one or more storage devices 720, such as hard drives, flash drives, optical storage, and the like, for persisting data and instructions similar, or in addition to, those stored in the processor and memory. The processor 702 can also communicate with various other components via the chipset 714 and an interface bus (or graphics bus, etc.), where those components can include communications devices 724 such as cellular modems or network cards, media components 726, such as graphics cards and audio components, and peripheral interfaces 770 for connecting peripheral devices, such as printers, keyboards, and the like. At least one cooling fan 772 or other such temperature regulating or reduction component can also be included as well, which can be driven by the processor or triggered by various other sensors or components on, or remote from, the device. Various other or alternative components and configurations can be utilized as well as known in the art for computing devices.

At least one processor 702 can obtain data from physical memory 716, such as a dynamic random access memory (DRAM) module, via a coherency fabric in some embodiments. It should be understood that various architectures can be utilized for such a computing device, that may include varying selections, numbers, and arguments of buses and bridges within the scope of the various embodiments. The data in memory may be managed and accessed by a memory controller, such as a DDR controller, through the coherency fabric. The data may be temporarily stored in a processor cache 704 in at least some embodiments. The computing device 700 can also support multiple I/O devices using a set of I/O controllers connected via an I/O bus. There may be I/O controllers to support respective types of I/O devices, such as a universal serial bus (USB) device, data storage (e.g., flash or disk storage), a network card, a peripheral component interconnect express (PCIe) card or interface 770, a communication device 724, a graphics or audio card 726, and a direct memory access (DMA) card, among other such options. In some embodiments, components such as the processor, controllers, and caches can be configured on a single card, board, or chip (i.e., a system-on-chip implementation), while in other embodiments at least some of the components may be located in different locations, etc.

An operating system (OS) running on the processor 702 can help to manage the various devices that may be utilized to provide input to be processed. This can include, for example, utilizing relevant device drivers to enable interaction with various I/O devices, where those devices may relate to data storage, device communications, user interfaces, and the like. The various I/O devices will typically connect via various device ports and communicate with the processor and other device components over one or more buses. There can be specific types of buses that provide for communications according to specific protocols, as may include peripheral component interconnect) PCI or small computer system interface (SCSI) communications, among other such options. Communications can occur using registers associated with the respective ports, including registers such as data-in and data-out registers. Communications can also occur using memory-mapped I/O, where a portion of the address space of a processor is mapped to a specific device, and data is written directly to, and from, that portion of the address space.

Such a device may be used, for example, as a server in a server farm or data warehouse. Server computers often have a need to perform tasks outside the environment of the CPU and main memory (i.e., RAM). For example, the server may need to communicate with external entities (e.g., other servers) or process data using an external processor (e.g., a General Purpose Graphical Processing Unit (GPGPU)). In such cases, the CPU may interface with one or more I/O devices. In some cases, these I/O devices may be special-purpose hardware designed to perform a specific role. For example, an Ethernet network interface controller (NIC) may be implemented as an application specific integrated circuit (ASIC) comprising digital logic operable to send and receive packets.

In an illustrative embodiment, a host computing, device is associated with various hardware components, software components and respective configurations that facilitate the execution of I/O requests. One such component is an I/O adapter that inputs and/or outputs data along a communication channel. In one aspect, the I/O adapter device can communicate as a standard bridge component for facilitating access between various physical and emulated components and a communication channel, in another aspect, the I/O adapter device can include embedded microprocessors to allow the I/O adapter device to execute computer executable instructions related to the implementation of management functions or the management of one or more such management functions, or to execute other computer executable instructions related to the implementation of the I/O adapter device, in some embodiments, the I/O adapter device may be implemented using multiple discrete hardware elements, such as multiple cards or other devices, A management controller can be configured in such a way to be electrically isolated from any other component in the host device other than the I/O adapter device. In some embodiments, the I/O adapter device is attached externally to the host device. In some embodiments, the I/O adapter device is internally integrated into the host device. Also in communication with the I/O adapter device may be an external communication port component for establishing communication channels between the host device and one or more network-based services or other network-attached or direct-attached computing devices. Illustratively, the external communication port component can correspond to a network switch, sometimes known as a Top of Rack ("TOR") switch. The I/O adapter device can utilize the external communication port component to maintain communication channels between one or more services and the host device, such as health check services, financial services, and the like.

The I/O adapter device can also be in communication with a Basic Input/Output System (BIOS) component. The BIOS component can include non-transitory executable code, often referred to as firmware, which can be executed by one or more processors and used to cause components of the host device to initialize and identify system devices such as the video display card, keyboard and mouse, hard disk drive, optical disc drive and other hardware. The BIOS component can also include or locate boot loader software that will be utilized to boot the host device. For example, in one embodiment, the BIOS component can include executable code that, when executed by a processor, causes the host device to attempt to locate Preboot Execution Environment (PSE) boot software. Additionally, the BIOS component can include or takes the benefit of a hardware latch that is electrically controlled by the I/O adapter device. The hardware latch can restrict access to one or more aspects of the BIOS component, such controlling modifications or configurations of the executable code maintained in the BIOS component. The BIOS component can be connected to (or in communication with) a number of additional computing device resources components, such as processors, memory, and the like. In one embodiment, such computing device resource components may be physical computing device resources in communication with other components via the communication channel. The communication channel can correspond to one or more communication buses, such as a shared bus (e.g., a front side bus, a memory bus), a point-to-point bus such as a PCI or PCI Express bus, etc., in which the components of the bare metal host device communicate. Other types of communication channels, communication media, communication buses or communication protocols (e.g., the Ethernet communication protocol may also be utilized. Additionally, in other embodiments, one or more of the computing device resource components may be virtualized hardware components emulated by the host device. In such embodiments, the I/O adapter device can implement a management process in which a host device is configured with physical or emulated hardware components based on a variety of criteria. The computing device resource components may be in communication with the I/O adapter device via the communication channel. In addition, a communication channel may connect a PCI Express device to a CPU via a northbridge or host bridge, among other such options.

In communication with the I/O adapter device via the communication channel may be one or more controller components for managing hard drives or other forms of memory. An example of a controller component can be a DATA hard drive controller. Similar to the BIOS component, the controller components can include or take the benefit of a hardware latch that is electrically controlled by the I/O adapter device. The hardware latch can restrict access to one or more aspects of the controller component. Illustratively, the hardware latches may be controlled together or independently. For example, the I/O adapter device may selectively close a hardware latch for one or more components based on a trust level associated with a particular user. In another example, the I/O adapter device may selectively close a hardware latch for one or more components based on a trust level associated with an author or distributor of the executable code to be executed by the I/O adapter device. In a further example, the I/O adapter device may selectively close a hardware latch for one or more components based on a trust level associated with the component itself. The host device can also include additional components that are in communication with one or more of the illustrative components associated with the host device. Such components can include devices, such as one or more controllers in combination with one or more peripheral devices, such as hard disks or other storage devices. Additionally, the additional components of the host device can include another set of peripheral devices, such as Graphics Processing Units ("GPUs"). The peripheral devices and can also be associated with hardware latches for restricting access to one or more aspects of the component. As mentioned above, in one embodiment, the hardware latches may be controlled together or independently.

As discussed, different approaches can be implemented in various environments in accordance with the described embodiments. As will be appreciated, although a network- or Web-based environment is used for purposes of explanation in several examples presented herein, different environments may be used, as appropriate, to implement various embodiments. Such a system can include at least one electronic client device, which can include any appropriate device operable to send and receive requests, messages or information over an appropriate network and convey information back to a user of the device. Examples of such client devices include personal computers, cell phones, handheld messaging devices, laptop computers, set-top boxes, personal data assistants, electronic book readers and the like. The network can include any appropriate network, including an intranet, the Internet, a cellular network, a local area network or any other such network or combination thereof. Components used for such a system can depend at least in part upon the type of network and/or environment selected. Protocols and components for communicating via such a network are well known and will not be discussed herein in detail. Communication over the network can be enabled via wired or wireless connections and combinations thereof. In this example, the network includes the Internet, as the environment includes a Web server for receiving requests and serving content in response thereto, although for other networks, an alternative device serving a similar purpose could be used, as would be apparent to one of ordinary skill in the art.

The illustrative environment includes at least one application server and a data store. It should be understood that there can be several application servers, layers or other elements, processes or components, which may be chained or otherwise configured, which can interact to perform tasks such as obtaining data from an appropriate data store. As used herein, the term "data store" refers to any device or combination of devices capable of storing, accessing and retrieving data, which may include any combination and number of data servers, databases, data storage devices and data storage media, in any standard, distributed or clustered environment. The application server can include any appropriate hardware and software for integrating with the data store as needed to execute aspects of one or more applications for the client device and handling a majority of the data access and business logic for an application. The application server provides access control services in cooperation with the data store and is able to generate content such as text, graphics, audio and/or video to be transferred to the user, which may be served to the user by the Web server in the form of HTML, XML or another appropriate structured language in this example. The handling of all requests and responses, as well as the delivery of content between the client device and the application server, can be handled by the Web server. It should be understood that the Web and application servers are not required and are merely example components, as structured code discussed herein can be executed on any appropriate device or host machine as discussed elsewhere herein.

The data store can include several separate data tables, databases or other data storage mechanisms and media for storing data relating to a particular aspect. For example, the data store illustrated includes mechanisms for storing content (e.g., production data) and user information, which can be used to serve content for the production side. The data store is also shown to include a mechanism for storing log or session data. It should be understood that there can be many other aspects that may need to be stored in the data store, such as page image information and access rights information, which can be stored in any of the above listed mechanisms as appropriate or in additional mechanisms in the data store. The data store is operable, through logic associated therewith, to receive instructions from the application server and obtain, update or otherwise process data in response thereto. In one example, a user might submit a search request for a certain type of item. In this case, the data store might access the user information to verify the identity of the user and can access the catalog detail information to obtain information about items of that type. The information can then be returned to the user, such as in a results listing on a Web page that the user is able to view via a browser on the user device. Information for a particular item of interest can be viewed in a dedicated page or window of the browser.

Each server typically will include an operating system that provides executable program instructions for the general administration and operation of that server and typically will include computer-readable medium storing instructions that, when executed by a processor of the server, allow the server to perform its intended functions. Suitable implementations for the operating system and general functionality of the servers are known or commercially available and are readily implemented by persons having ordinary skill in the art, particularly in light of the disclosure herein.

The environment in one embodiment is a distributed computing environment utilizing several computer systems and components that are interconnected via communication links, using one or more computer networks or direct connections. However, it will be appreciated by those of ordinary skill in the art that such a system could operate equally well in a system having fewer or a greater number of components than are illustrated. Thus, the depiction of the systems herein should be taken as being illustrative in nature and not limiting to the scope of the disclosure.

The various embodiments can be further implemented in a wide variety of operating environments, which in some cases can include one or more user computers or computing devices which can be used to operate any of a number of applications. User or client devices can include any of a number of general purpose personal computers, such as desktop or laptop computers running a standard operating system, as well as cellular, wireless and handheld devices running mobile software and capable of supporting a number of networking and messaging protocols. Such a system can also include a number of workstations running any of a variety of commercially-available operating systems and other known applications for purposes such as development and database management. These devices can also include other electronic devices, such as dummy terminals, thin-clients, gaming systems and other devices capable of communicating via a network.

Most embodiments utilize at least one network that would be familiar to those skilled in the art for supporting communications using any of a variety of commercially-available protocols, such as TCP/IP, FTP, UPnP, NFS, and CIFS. The network can be, for example, a local area network, a wide-area network, a virtual private network, the Internet, an intranet, an extranet, a public switched telephone network, an infrared network, a wireless network and any combination thereof.

In embodiments utilizing a Web server, the Web server can run any of a variety of server or mid-tier applications, including HTTP servers, FTP servers, CGI servers, data servers, Java servers and business application servers. The server(s) may also be capable of executing programs or scripts in response requests from user devices, such as by executing one or more Web applications that may be implemented as one or more scripts or programs written in any programming language, such as Java®, C, C# or C++ or any scripting language, such as Perl, Python or TCL, as well as combinations thereof. The server(s) may also include database servers, including without limitation those commercially available from Oracle®, Microsoft®, Sybase® and IBM® as well as open-source servers such as MySQL, Postgres, SQLite, MongoDB, and any other server capable of storing, retrieving and accessing structured or unstructured data. Database servers may include table-based servers, document-based servers, unstructured servers, relational servers, non-relational servers or combinations of these and/or other database servers.

The environment can include a variety of data stores and other memory and storage media as discussed above. These can reside in a variety of locations, such as on a storage medium local to (and/or resident in) one or more of the computers or remote from any or all of the computers across the network. In a particular set of embodiments, the information may reside in a storage-area network (SAN) familiar to those skilled in the art. Similarly, any necessary files for performing the functions attributed to the computers, servers or other network devices may be stored locally and/or remotely, as appropriate. Where a system includes computerized devices, each such device can include hardware elements that may be electrically coupled via a bus, the elements including, for example, at least one central processing unit (CPU), at least one input device (e.g., a mouse, keyboard, controller, touch-sensitive display element or keypad) and at least one output device (e.g., a display device, printer or speaker). Such a system may also include one or more storage devices, such as disk drives, magnetic tape drives, optical storage devices and solid-state storage devices such as random access memory (RAM) or read-only memory (ROM), as well as removable media devices, memory cards, flash cards, etc.

Such devices can also include a computer-readable storage media reader, a communications device (e.g., a modem, a network card (wireless or wired), an infrared communication device) and working memory as described above. The computer-readable storage media reader can be connected with, or configured to receive, a computer-readable storage medium representing remote, local, fixed and/or removable storage devices as well as storage media for temporarily and/or more permanently containing, storing, transmitting and retrieving computer-readable information. The system and various devices also typically will include a number of software applications, modules, services or other elements located within at least one working memory device, including an operating system and application programs such as a client application or Web browser. It should be appreciated that alternate embodiments may have numerous variations from that described above. For example, customized hardware might also be used and/or particular elements might be implemented in hardware, software (including portable software, such as applets) or both. Further, connection to other computing devices such as network input/output devices may be employed.

Storage media and other non-transitory computer readable media for containing code, or portions of code, can include any appropriate media known or used in the art, such as but not limited to volatile and non-volatile, removable and non-removable media implemented in any method or technology for storage of information such as computer readable instructions, data structures, program modules or other data, including RAM, ROM, EEPROM, flash memory or other memory technology, CD-ROM, digital versatile disk (DVD) or other optical storage, magnetic cassettes, magnetic tape, magnetic disk storage or other magnetic storage devices or any other medium which can be used to store the desired information and which can be accessed by a system device. Based on the disclosure and teachings provided herein, a person of ordinary skill in the art will appreciate other ways and/or methods to implement the various embodiments.

The specification and drawings are, accordingly, to be regarded in an illustrative rather than a restrictive sense. It will, however, be evident that various modifications and changes may be made thereunto without departing from the broader spirit and scope of the invention as set forth in the claims.

What is claimed is:

1. A computer-implemented method, comprising:
   receiving data for a first transmission between a host memory and a storage device;
   generating a first checksum for the data received in the first transmission;
   causing the data from the first transmission to be at least temporarily withheld from being written to the storage device;
   requesting a second transmission of the data from the host memory to the storage device;
   generating a second checksum for the data received in the second transmission;
   comparing, using a storage processor, the first checksum and the second checksum; and
   validating that the data was transmitted without error if the first checksum is equal to the second checksum, wherein the data from the first transmission is permitted to be written to the storage device after the validation that the data was without error.

2. The computer-implemented method of claim 1, further comprising:
   activating an error handling procedure if the first checksum is determined to be different from the second checksum.

3. The computer-implemented method of claim 1, wherein the first transmission is from the host memory to the storage device for a write operation, the method further comprising:
   causing the data from the first transmission or the second transmission to be written to the storage device.

4. The computer-implemented method of claim 1, wherein the first transmission is from the storage device to the host memory for a read operation, and wherein the second transmission is a retransmission of the data transmitted from the host memory back to the storage device.

5. The computer-implemented method of claim 1, wherein the storage processor communicates with the storage device using both a PCI Express (PCIe) interface and a non-volatile memory express (NVMe) interface.

6. A computer-implemented method comprising:
   generating first protection information for data in a first transmission between a source and a recipient;
   causing the data from the first transmission to be at least temporarily withheld from being written to the recipient;
   causing the data to be transmitted in a second transmission between the source and the recipient;
   generating second protection information for the data in the second transmission; and
   verifying integrity of the data in at least one of the first transmission or the second transmission if the first protection information is equal to the second protection information, wherein the data from the first transmission is permitted to be written to the recipient after the integrity of the data is verified.

7. The computer-implemented method of claim 6, further comprising:
   activating an error handling procedure if the first protection information is determined to be different from the second protection information.

8. The computer-implemented method of claim 6, wherein the source is a host memory and the recipient is a storage device, and wherein the first transmission is for a write operation to be performed for the data to the storage device.

9. The computer-implemented method of claim 8, further comprising:
   causing the data from the first transmission to be written to the storage device before verifying the integrity; and
   deleting from the data from the storage device if the integrity is unable to be verified.

10. The computer-implemented method of claim 8, further comprising:
    causing the data from the second transmission to be written to the storage device in response to verifying the integrity.

11. The computer-implemented method of claim 6, wherein the source is a storage device and the recipient is host memory, and wherein the first transmission is for a read operation to be performed for the data to be transmitted to the host memory, and wherein the second transmission is a retransmission of the data transmitted to the host memory back to the storage device.

12. The computer-implemented method of claim 6, wherein verifying the integrity includes comparing, using a storage processor, the first protection information and the second protection information.

13. The computer-implemented method of claim 11, wherein the recipient communicates with the storage device using a non-volatile memory express (NVMe) interface or a serial AT attachment (SATA) interface.

14. The computer-implemented method of claim 6, wherein the protection information includes at least one of a checksum, a digital signature, a cyclic redundancy check (CRC) value, a digital fingerprint, a hash value, a logical address, or a user-definable application identifier.

15. The computer-implemented method of claim 6, wherein the first transmission is for a data storage operation, a networking operation, or a high performance computing operation.

16. A input/output (I/O) device, comprising:
a storage processor; and
memory including instructions that, when executed by the storage processor, causes the I/O device to:
generate first protection information for data in a first transmission between a source and a recipient;
cause the data from the first transmission to be at least temporarily withheld from being written to the recipient;
cause the data to be transmitted in a second transmission between the source and the recipient;
generate second protection information for the data in the second transmission; and
verify integrity of the data in at least one of the first transmission or the second transmission if the first protection information is equal to the second protection information, wherein the data from the first transmission is permitted to be written to the recipient after the integrity of the data is verified.

17. The I/O device of claim 16, wherein the instructions when executed further cause the I/O device to:
activate an error handling procedure if the first protection information is determined to be different from the second protection information.

18. The I/O device of claim 16, wherein a symmetrical data integrity device sits along a transmission path between the source and the recipient.

19. The I/O device of claim 18, wherein the source is a host memory and the recipient is a storage device, wherein the first transmission is for a write operation to be performed for the data to the storage device, and wherein the instructions when executed further cause the symmetrical data integrity device to:
cause the data from the first transmission or the second transmission to be written to the storage device.

20. The I/O device of claim 16, wherein the source is a storage device and the recipient is a host memory, wherein the first transmission is for a read operation to be performed for the data to be transmitted to the host memory, and wherein the second transmission is a retransmission of the data transmitted to the host memory back to the storage device.

* * * * *